(12) United States Patent
Hou

(10) Patent No.: US 11,594,585 B2
(45) Date of Patent: Feb. 28, 2023

(54) OLED WITH BANK HAVING BASE AND PROTRUSION PORTIONS

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 131 days.

(21) Appl. No.: 17/253,196

(22) PCT Filed: Apr. 22, 2020

(86) PCT No.: PCT/CN2020/086068
§ 371 (c)(1),
(2) Date: Dec. 17, 2020

(87) PCT Pub. No.: WO2020/216237
PCT Pub. Date: Oct. 29, 2020

(65) Prior Publication Data
US 2021/0118967 A1 Apr. 22, 2021

(30) Foreign Application Priority Data
Apr. 24, 2019 (CN) .......................... 201910335137.5

(51) Int. Cl.
*H01L 27/32* (2006.01)
*H01L 51/56* (2006.01)
(52) U.S. Cl.
CPC .......... *H01L 27/3246* (2013.01); *H01L 51/56* (2013.01)

(58) Field of Classification Search
CPC .......................... H01L 27/3246; H01L 51/56
See application file for complete search history.

(56) References Cited

U.S. PATENT DOCUMENTS

2019/0051712 A1* 2/2019 Yu ...................... H01L 51/0005

FOREIGN PATENT DOCUMENTS

| CN | 106783918 A | 5/2017 |
|---|---|---|
| CN | 107204359 A | 9/2017 |
| CN | 107452782 A | 12/2017 |
| CN | 108091580 A | 5/2018 |
| CN | 207977317 U | 10/2018 |

(Continued)

OTHER PUBLICATIONS

China Patent Office, First Office Action dated Jul. 29, 2020 for application No. CN201910335137.5.

(Continued)

*Primary Examiner* — Peter Bradford
(74) *Attorney, Agent, or Firm* — Houtteman Law LLC

(57) ABSTRACT

The present disclosure provides an array substrate, a method for manufacturing the array substrate, a display panel and a display apparatus. The array substrate of the present disclosure includes a substrate and a pixel definition layer on the substrate, the pixel definition layer includes a base structure on the substrate, the base structure defines a plurality of openings on the substrate, each of the plurality of openings corresponds to one pixel region; and at least one protrusion structure provided on the base structure, wherein the at least one protrusion structure protrudes towards a direction away from the substrate, and the at least one protrusion structure has hydrophobic property.

18 Claims, 3 Drawing Sheets

(56) References Cited

FOREIGN PATENT DOCUMENTS

| CN | 108922908 | A |   | 11/2018 |           |
|----|-----------|---|---|---------|-----------|
| CN | 109103221 | A |   | 12/2018 |           |
| CN | 109309112 | A |   | 2/2019  |           |
| CN | 109994529 | A | * | 7/2019  |           |
| CN | 110034170 | A |   | 7/2019  |           |
| CN | 110429100 | A | * | 11/2019 | H01L 27/32 |
| CN | 111129099 | A | * | 5/2020  | H01L 27/3246 |

OTHER PUBLICATIONS

China Patent Office, Second Office Action dated Oct. 29, 2020 for application No. CN201910335137.5.
China Patent Office, Decision of rejection dated Jan. 19, 2021 for application No. CN201910335137.5.

* cited by examiner

OLED WITH BANK HAVING BASE AND PROTRUSION PORTIONS

CROSS REFERENCE TO RELATED APPLICATIONS

The present application claims the priority of the Chinese Patent Application with the Application No. 201910335137.5 filed on Apr. 24, 2019, which is incorporated herein in the entire by reference.

TECHNICAL FIELD

The present disclosure relates to the field of display technology, in particular to an array substrate and a manufacturing method thereof, a display panel and a display apparatus.

BACKGROUND

Compared with a Liquid Crystal Display (LCD) device, an Organic Light Emitting Diode (OLED) Display device has advantages of self-luminescence, fast response, wide viewing angle, high brightness, bright color, lightness, thinness, and the like, and is considered as a next generation display product.

SUMMARY

The present disclosure is directed to provide an array substrate and a manufacturing method thereof, a display panel and a display apparatus.

In an aspect, the present disclosure provides an array substrate including a substrate and a pixel definition layer on the substrate, the pixel definition layer includes a base structure on the substrate, the base structure defines a plurality of openings on the substrate, each of the plurality of openings corresponds to one pixel region; and at least one protrusion structure is provided on the base structure, the at least one protrusion structure protrudes towards a direction away from the substrate, and the protrusion structure has hydrophobic property.

In an embodiment of the present disclosure, a height of the protrusion structure in a direction perpendicular to the substrate is in a range from about 100 nanometers to about 800 nanometers.

In an embodiment of the present disclosure, a height of the base structure in a direction perpendicular to the substrate is in a range of about 1 micron to about 5 microns.

In an embodiment of the present disclosure, the protrusion structure has a cone shape.

In an embodiment of the present disclosure, the protrusion structure includes at least one kind of nanoparticles.

In an embodiment of the present disclosure, the at least one kind of nanoparticles are selected from magnetic particles and charged particles.

In an embodiment of the present disclosure, the nanoparticle has a diameter of about 20 nanometers to about 200 nanometers.

In an embodiment of the present disclosure, the nanoparticle is the magnetic particle, and a material of the nanoparticle includes one or more of ferroferric oxide, ferric oxide and ferrous oxide; the nanoparticle is the charged particle, and a material of the nanoparticle includes titanium dioxide.

In an embodiment of the present disclosure, the pixel definition layer includes a plurality of the protrusion structures protruding towards a direction away from the substrate on the base structure, the plurality of protrusion structures are uniformly distributed on the base structure, and a distance between two adjacent protrusion structures is in a range of about 50 nm to about 800 nm.

In an embodiment of the present disclosure, the material of the protrusion structure includes one or more of polymethyl methacrylate, fluorinated polymethyl methacrylate, polyimide, and fluorinated polyimide.

In an embodiment of the present disclosure, the protrusion structure is integrally formed with the base structure as a single piece.

In an embodiment of the present disclosure, the array substrate further includes an organic light emitting diode in each of a plurality of pixel regions defined by the pixel definition layer.

In an aspect, the present disclosure provides a display panel including the array substrate according to the above embodiments of the present disclosure.

In an aspect, the present disclosure provides a display apparatus including the display panel according to the above embodiments of the present disclosure.

In an aspect, the present disclosure provides a method for manufacturing an array substrate, including: providing a substrate; forming a film layer on the substrate; applying an external force to the film layer, such that a base and at least one protrusion structure which is provided on the base and protrudes towards a direction away from the substrate are formed in the film layer, the protrusion structure has hydrophobic property; and performing a patterning process on the film layer with the at least one protrusion structure formed thereon, thereby forming a base structure on the substrate and at least one protrusion structure on the base structure, such that the base structure defines a plurality of openings on the substrate, and each of the plurality of openings corresponds to one pixel region.

In an embodiment of the present disclosure, the protrusion structure has a cone shape, a height of the protrusion structure in a direction perpendicular to the substrate is in a range from about 100 nanometers to about 800 nanometers; and a height of the base structure in a direction perpendicular to the substrate is in a range of about 1 micron to about 5 microns.

In an embodiment of the present disclosure, the forming a film layer on the substrate includes coating a photoresist layer on the substrate such that the photoresist contains nanoparticles, and a concentration of the nanoparticles in the photoresist is about 0.2 wt % to about 5 wt %.

In an embodiment of the present disclosure, before the applying the external force to the film layer, the method further includes performing a pre-baking treatment on the film layer.

In an embodiment of the present disclosure, the nanoparticles are magnetic particles, and the applying an external force to the film layer, such that a base and at least one protrusion structure which is provided on the base and protrudes towards a direction away from the substrate are formed in the film layer includes: placing the substrate coated with the photoresist layer in an external magnetic field to cause the magnetic particles to move towards the direction away from the substrate, such that the at least one protrusion structure which protrudes towards the direction away from the substrate is formed in the film layer.

In an embodiment of the present disclosure, the nanoparticles are charged particles, and the applying an external force to the film layer, such that a base and at least one protrusion structure which is provided on the base and protrudes towards a direction away from the substrate are formed in the film layer includes: placing the substrate coated with the photoresist layer in an external electric field to cause the charged particles to move towards the direction away from the substrate, such that the at least one protrusion structure which protrudes towards the direction away from the substrate is formed in the film layer.

BRIEF DESCRIPTION OF DRAWINGS

The above and/or additional aspects and advantages of the present disclosure will become apparent and readily appreciated from the following description of embodiments, taken in conjunction with drawings, in which.

DETAIL DESCRIPTION OF EMBODIMENTS

Figure 1A:
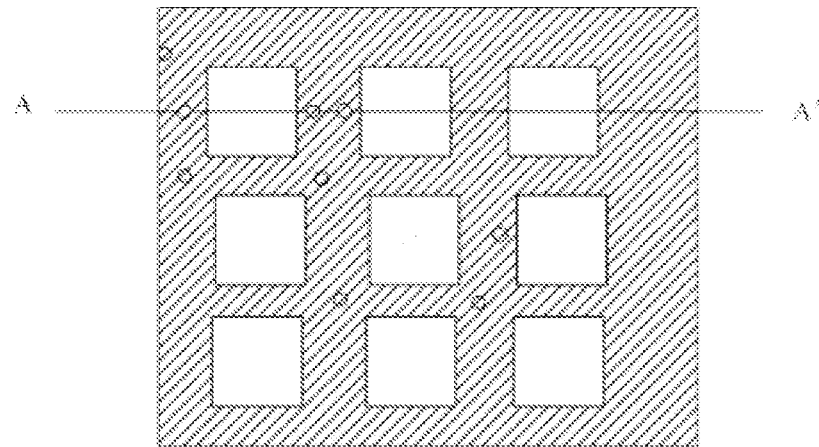
FIG. 1A is a top view of an array substrate according to an embodiment of the present disclosure.

Embodiments of the present disclosure will be described below in detail, examples of the embodiments are illustrated in the drawings, in which same or similar reference numerals refer to same or similar elements or elements having same or similar functions throughout the present disclosure. Embodiments described below with reference to the accompanying drawings are illustrative only for the purpose of explaining the present disclosure, and are not to be construed as limiting the present disclosure.

It will be understood by one of ordinary skill in the art that, as used herein, singular terms "a", "an" and "the" may include plural forms as well, unless expressly stated otherwise. It will be further understood that terms "comprises", "comprising", "includes", "including" when used in this specification, specify the presence of stated features, integers, steps, operations, elements, and/or components, but do not preclude the presence or addition of one or more other features, integers, steps, operations, elements, components, and/or combinations thereof. It will be understood that when being referred to as being "connected" to another element, an element may be connected to other element directly or through an intervening element. Further, "connected" as used herein may include wirelessly connected. As used herein, the term "and/or" includes all or any element and all combinations of one or more of associated listed items.

It will be understood by one of ordinary skill in the art that, unless otherwise defined, all terms (including technical terms and scientific terms) used herein have same meaning as commonly understood by one of ordinary skill in the art. It will be further understood that terms, such as those defined in commonly used dictionaries, should be interpreted as having a meaning that is consistent with their meaning in the context of the prior art and will not be interpreted in an idealized or overly formal sense unless expressly so defined herein.

A deposition method for a film layer of an organic electroluminescent device mainly includes a vacuum evaporation and a solution process. The vacuum evaporation is suitable for organic micromolecules, can form a film layer with a good uniformity, and is a relatively mature technology, but an investment for the corresponding equipment is large, a utilization ratio for a material is low, and an alignment precision of a mask plate of a large-size product is low. The solution process includes spin coating, ink-jet printing, nozzle coating and the like, is suitable for a polymer material and soluble micromolecules, and has characteristics of low equipment cost and outstanding advantages in large-scale and large-size production.

When manufacturing an organic light-emitting diode by ink-jet printing, it is necessary to limit ink for ink-jet printing in a pixel by a pixel definition layer having hydrophobic property and to control a film uniformity of the ink in the pixel. In the related art, the hydrophobic property of the pixel definition layer is derived from fluororesin with a low surface energy, that is, the hydrophobic property of the pixel definition layer is provided by a material having the hydrophobic property.

An embodiment of the present disclosure provides a novel pixel definition layer having the hydrophobic property, the pixel definition layer has the hydrophobic property by providing a protrusion structure, without requiring whether a material of the provided protrusion structure (and a material contained therein) itself has the hydrophobic property.

Specific embodiments of the present disclosure will be described with reference to the drawings.

Figure 1B:
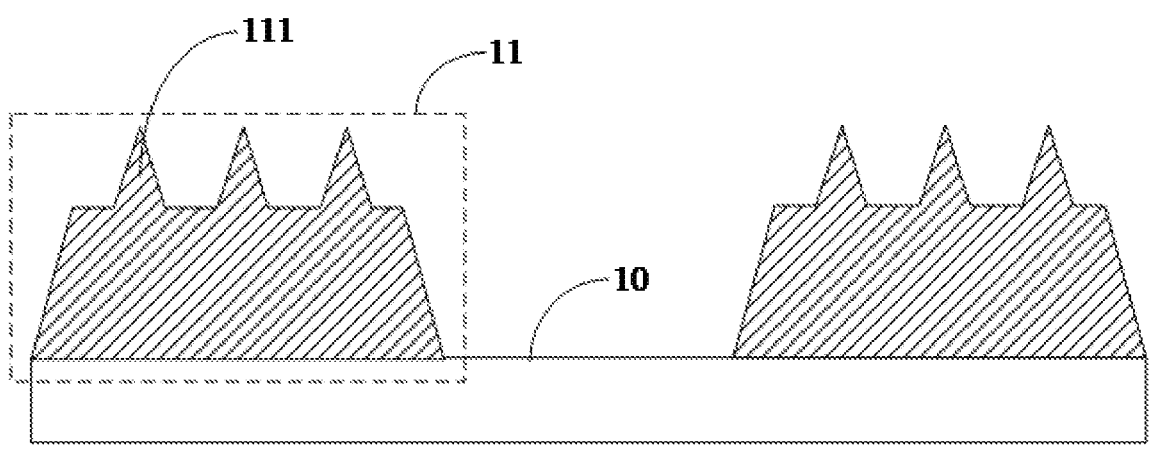
FIG. 1B is a cross-sectional view of the array substrate taken along a line AA' of FIG. 1A.

FIG. 1A is a top view of an array substrate according to an embodiment of the present disclosure; FIG. 1B is a cross-sectional view of the array substrate along a line AA' in FIG. 1A. The array substrate provided by the embodiment of the present disclosure includes a substrate 10 and a pixel definition layer on the substrate, the pixel definition layer includes a base structure (a portion as shown by oblique lines in FIG. 1A and a portion having a trapezoidal cross section as shown in FIG. 1B) on the substrate 10, the base structure defines a plurality of openings (a blank portion as shown in FIG. 1A and a blanking region within a defining film layer 11 as shown in FIG. 1B) on the substrate, each of the openings corresponds to a pixel region; and at least one protrusion structure 111 (shown as a circle in FIG. 1A) on the base structure protruding in a direction away from the substrate, and the protrusion structure has the hydrophobic property. In the embodiment of the present disclosure, the defining film layer 11 includes a portion (i.e., a base structure) having a trapezoidal cross section and at least one protrusion structure 111 on the portion.

As shown in FIG. 1B, each of the base structures has a trapezoidal cross section, and a height of the base structure in a direction perpendicular to the substrate is in a range of about 1 micrometer to about 5 micrometers. At least one protrusion structure 111 may be provided on each of the base structures; the protrusion structures 111 on the base structure protrude in a direction away from the substrate, and the protrusion structures 111 have the hydrophobic property. A height of the protrusion structure 111 in the direction perpendicular to the substrate is in a range from about 100 nanometers to about 800 nanometers. The protrusion structures 111 in the embodiment of the present disclosure have a cone shape as an example, and the embodiment of the present disclosure does not define the protrusion structure 111 to have a specific shape.

Specifically, the substrate 10 may be a glass substrate, or may be a glass substrate on which a driving circuit of the OLED is fabricated. In the procedure of preparing the OLED by ink-jet printing, a film layer is formed, a part of the film layer at a position corresponding to a pixel is removed to form a base structure, such that the position after the part of the film layer is removed is one pixel position, and further, ink for ink-jet printing is limited in the one pixel position.

In the pixel definition layer according to the embodiment of the present disclosure, at least one protrusion structure 111 is provided in the defining film layer 11 on the substrate 10 and the protrusion structures 111 are on a side of the defining film layer 11 distal to the substrate 10, so that the protrusion structures 111 have the hydrophobic property. If a material of the defining film layer 11 in the embodiment of the present disclosure is a hydrophilic material, because the defining film layer is provided with at least one protrusion structure 111, and the protrusion structures 111 are distal to the substrate 10 and have the hydrophobic property, the defining film layer 11 also has the hydrophobic property due to the protrusion structures 111, and the ink in an ink-jet printing process may be well limited in a pixel; if a material of the defining film layer 11 in the embodiment of the present disclosure is a hydrophobic material, due to the above property of the protrusion structures 111, hydrophobic capability of the defining film layer 11 may be further increased, and the ink in the ink-jet printing process is better limited in the pixel.

FIGS. 1A and 1B schematically show a structure of a pixel definition layer of the present disclosure. In one embodiment of the present disclosure, the cross-sectional view of the pixel definition layer shown in FIG. 1B is obtained by taking along a line AA' in FIG. 1A. In other embodiments of the present disclosure, a line perpendicular to the line AA' in FIG. 1A may be used to obtain a cross-sectional view, which has a structure similar to that of the current pixel definition layer shown in FIG. 1B.

The protrusion structure 111 of the embodiment of the present disclosure includes at least one kind of nanoparticles, and the nanoparticles make it easier to form the protrusion structures 111 on the base structure when the pixel definition layer is manufactured, so that the pixel definition layer has good hydrophobic property.

The nanoparticles of the embodiment of the present disclosure are magnetic particles, or charged particles; in this way, when the pixel definition layer is manufactured, the protrusion structures 111 having the hydrophobic property may be well formed, and a specific forming process of the protrusion structures 111 will be described in detail in the following method.

The nanoparticles of the embodiment of the present disclosure have a diameter of about 20 nm to about 200 nm, so that the formed protrusion structures 111 have excellent hydrophobic property.

A material of the nanoparticles of the embodiment of the present disclosure includes any one or more of ferroferric oxide ($Fe_3O_4$), ferric oxide ($Fe_2O_3$), and ferrous oxide (FeO); therefore, the material can be selected in a simpler and more convenient way, and a cost for the selection will not be increased by using these conventional materials.

As shown in FIG. 1B, the protrusion structure 111 of the embodiment of the present disclosure has a height of about 100 nm to about 800 nm, and the protrusion structure 111 in this range of the height may well limit the ink within a pixel during the ink-jet printing process.

As shown in FIG. 1B, the base structure of the embodiment of the present disclosure has a height of about 1 micron to about 5 microns. In one embodiment of the present disclosure, for example, the defining film layer 11 has a height of 2 microns, the protrusion structure 111 has a height of 600 nanometers, so the trapezoidal base structure under the protrusion structures 111 in FIG. 1B has a height of 1400 nanometers.

As shown in FIG. 1B, when the defining film layer 11 of the embodiment of the present disclosure includes at least two protrusion structures 111 (FIG. 1B shows that the defining film layer 11 includes three protrusion structures 111), a distance between two adjacent protrusion structures 111 is 50 nanometers to 800 nanometers; in the embodiment of the present disclosure, the distance between two adjacent protrusion structures 111 may be not equal to a distance between any other two adjacent protrusion structures 111. For example, for the defining the film layer 11 at the left side of FIG. 1B, a distance between the leftmost protrusion structure 111 and the protrusion structure 111 at the middle position is 50 nm, and a distance between the protrusion structure 111 at the middle position and the rightmost protrusion structure 111 is 60 nm. In the case that the nanoparticles are uniformly distributed, the distance between two adjacent protrusion structures 111 may alternatively be equal to a distance between any other two adjacent protrusion structures 111 in the embodiment of the present disclosure.

A material of the defining film layer 11 of the embodiment of the present disclosure includes any one or more of polymethyl methacrylate, fluorinated polymethyl methacrylate, polyimide, and fluorinated polyimide. Specifically, polymethyl methacrylate and polyimide are hydrophilic materials; fluorinated polymethyl methacrylate and fluorinated polyimide are hydrophobic materials.

The protrusion structure 111 and the base structure of the embodiment of the present disclosure are integrally formed as a single piece to form the defining film layer 11.

A specific pixel definition layer according to an embodiment of the present disclosure is given below.

As shown in FIG. 1B, polymethyl methacrylate is selected as a material for the defining film layer 11, and the protrusion structures 111 include a plurality of magnetic nanoparticles, specifically a plurality of nanoparticles of ferroferric oxide. In FIG. 1B, in addition to the plurality of ferroferric oxide nanoparticles, the protrusion structures 111 include polymethyl methacrylate.

Specifically, the nanoparticles of ferroferric oxide has a diameter of 50 nanometers, a concentration of the nanoparticles of ferroferric oxide in the polymethyl methacrylate is 1 wt %, the defined film layer 11 has a height of 2 micrometers, and the protrusion structure 111 has a height of 500 nanometers; in the case that the nanoparticles are uniformly distributed, a distance between two adjacent protrusion structures 111 is 200 nm.

The array substrate of the embodiment of the present disclosure further includes an organic light emitting diode provided in each of a plurality of pixel regions defined by the pixel definition layer.

Based on a same inventive concept, an embodiment of the present disclosure further provides a display panel, which includes the array substrate provided by the embodiment of the present disclosure. Because the display panel includes the array substrate provided by the embodiment of the present disclosure, the display panel provided by the embodiment of the present disclosure has same beneficial effects as the array substrate, and details are not repeated here.

Based on a same inventive concept, an embodiment of the present disclosure further provides a display apparatus, which includes the display panel provided by the embodiment of the present disclosure. Because the display apparatus includes the display panel provided by the embodiment of the present disclosure, the display apparatus provided by the embodiment of the present disclosure has same beneficial effects as the display panel, and details are not repeated here.

Figure 2A:
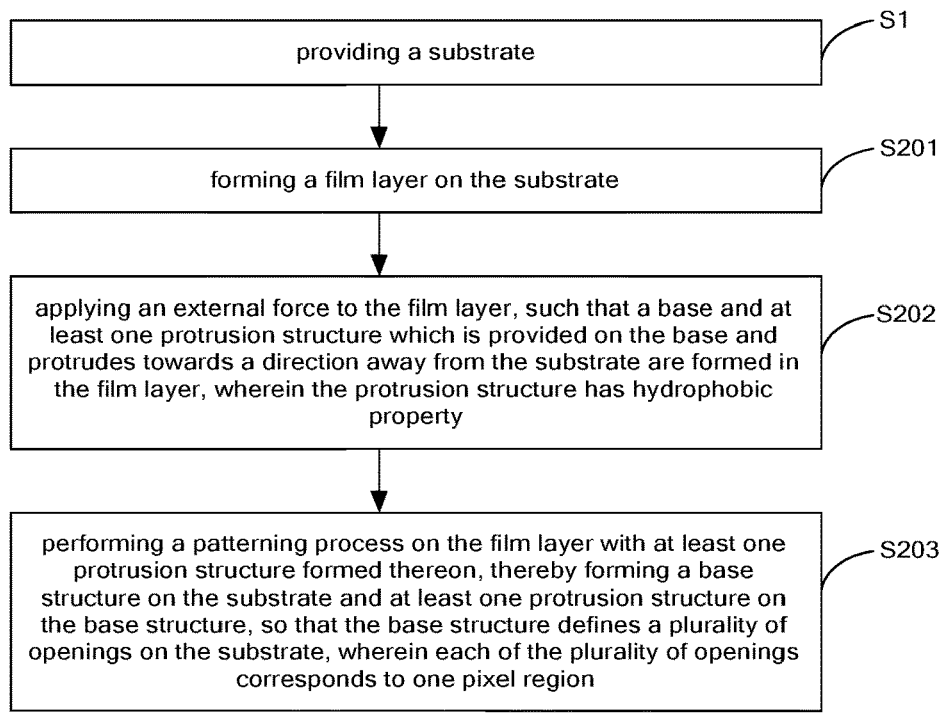
FIG. 2A and FIG. 2B are flow charts of a method for manufacturing an array substrate according to an embodiment of the disclosure.
Figure 2B:
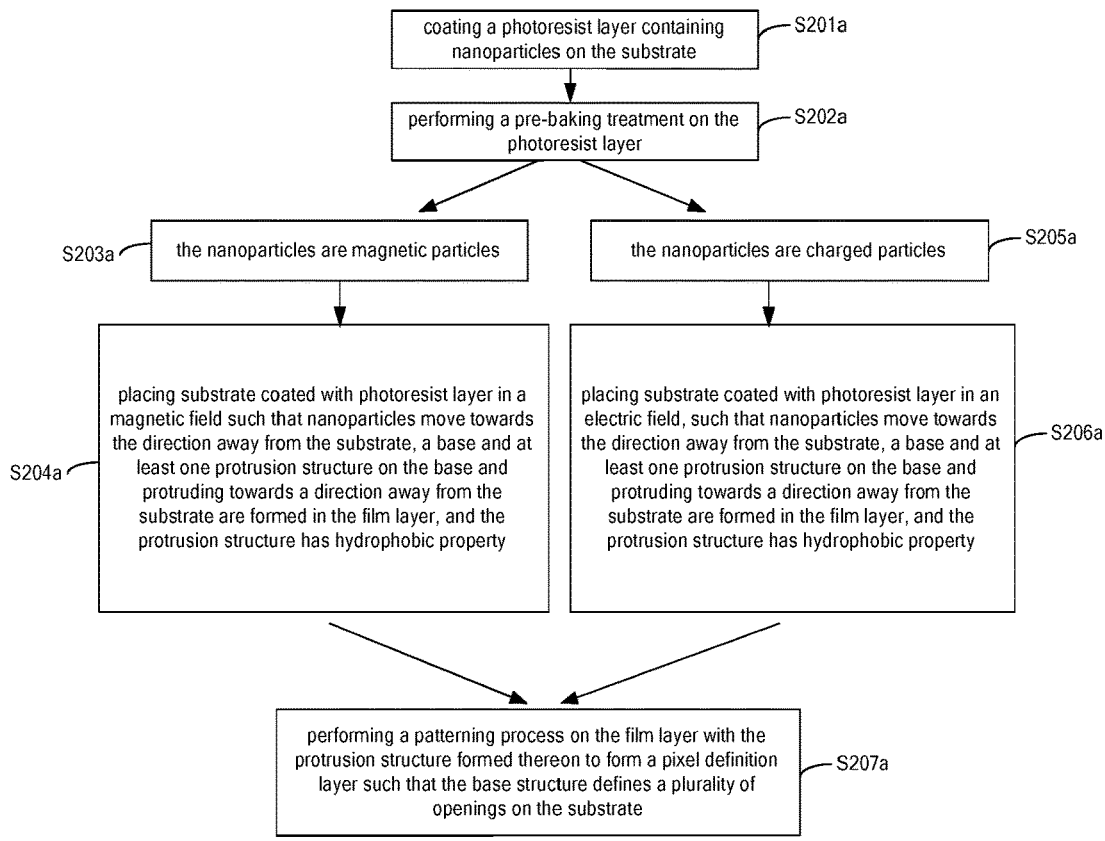

Based on a same inventive concept, an embodiment of the present disclosure also provides a method for manufacturing the array substrate. FIG. 2A and FIG. 2B each are a flow chart of a method for manufacturing an array substrate according to an embodiment of the present disclosure. As shown in FIG. 2A, the method includes steps of:

S1, providing a substrate;

S201, forming a film layer on the substrate;

S202, applying an external force to the film layer, such that a base and at least one protrusion structure which is provided on the base and protrudes towards a direction away from the substrate are formed in the film layer, wherein the formed protrusion structure has hydrophobic property;

S203, performing a patterning process on the film layer with the at least one protrusion structure formed thereon, thereby forming a base structure on the substrate and at least one protrusion structure on the base structure, so that the base structure defines a plurality of openings on the substrate, and each of the plurality of openings corresponds to one pixel region.

In one embodiment of the present disclosure, each of the plurality of base structures has a trapezoidal cross section, and a height of the base structure in a direction perpendicular to the substrate is in a range of about 1 micron to about 5 microns. In one embodiment of the present disclosure, the protrusion structures 111 each have a cone shape, and a height of the protrusion structures in the direction perpendicular to the substrate is in a range of about 100 nanometers to about 800 nanometers.

Specifically, the substrate 10 in the embodiment of the present disclosure may be a glass substrate, and may alternatively be a glass substrate on which a driving circuit of an OLED is fabricated.

In S201, forming a film layer on the substrate includes steps of:

coating a photoresist layer on the substrate, wherein the photoresist layer mainly contains a high polymer material for forming the film layer, such as any one or more of polymethyl methacrylate, fluorinated polymethyl methacrylate, polyimide and fluorinated polyimide; the photoresist layer also contains nanoparticles.

Specifically, a concentration of the nanoparticles in the photoresist layer is about 0.2 wt % to about 5 wt %.

Before the applying the external force to the film layer in S202, the method further includes: performing a pre-baking treatment on the film layer.

Solvent in the photoresist layer may be slowly and completely escaped out through the pre-baking treatment, so that the photoresist layer is well dried.

The nanoparticles in the embodiment of the present disclosure are magnetic particles, or charged particles; in the above S202, applying an external force to the film layer, such that a base and at least one protrusion structure which is provided on the base and protrudes towards a direction away from the substrate are formed in the film layer includes: placing the substrate coated with the photoresist layer in an external magnetic field or an external electric field to cause the nanoparticles to move towards the direction away from the substrate, so that at least one protrusion structure which protrudes towards the direction away from the substrate is formed in the film layer.

As shown in FIG. 2B, in an embodiment of the present disclosure, a method for manufacturing an array substrate includes steps of:

S201a, coating a photoresist layer containing nanoparticles on the substrate such that a concentration of the nanoparticles in the photoresist layer is about 0.2 wt % to about 5 wt %.

S202a, performing a pre-baking treatment on the photoresist layer.

A temperature for the pre-baking treatment is about 80° C. to about 120° C. for a time period of about 10 seconds to about 300 seconds. Solvent in the photoresist layer may be slowly and completely escaped out through the pre-baking treatment, so that the photoresist layer is well dried.

S203a and S204a, when the nanoparticles are magnetic particles, placing the substrate coated with the photoresist layer in an external magnetic field, so that the nanoparticles move towards the direction away from the substrate, such that a base and at least one protrusion structure which is provided on the base and protrudes towards a direction away from the substrate are formed in the film layer, wherein the formed protrusion structure has hydrophobic property. An intensity of the magnetic field is in the range of about 50 gauss to about 500 gauss. For example, the nanoparticles are ferroferric oxide, ferric oxide, or ferrous oxide.

S205a and S206a, when the nanoparticles are charged particles, placing the substrate coated with the photoresist layer in an external electric field, so that the nanoparticles move towards the direction away from the substrate, such that a base and at least one protrusion structure which is provided on the base and protrudes towards a direction away from the substrate are formed in the film layer, wherein the formed protrusion structure has hydrophobic property. For example, the nanoparticles are charged particles of titanium dioxide.

S207a, performing a patterning process on the film layer with the at least one protrusion structure formed thereon, thereby forming a base structure on the substrate and at least one protrusion structure on the base structure (i.e. forming a pixel definition layer), such that the base structure defines a plurality of openings on the substrate, wherein each of the plurality of openings corresponds to one pixel region.

A method for manufacturing an array substrate according to an embodiment of the present disclosure will be described below in detail with reference to a specific embodiment.

Figure 3:
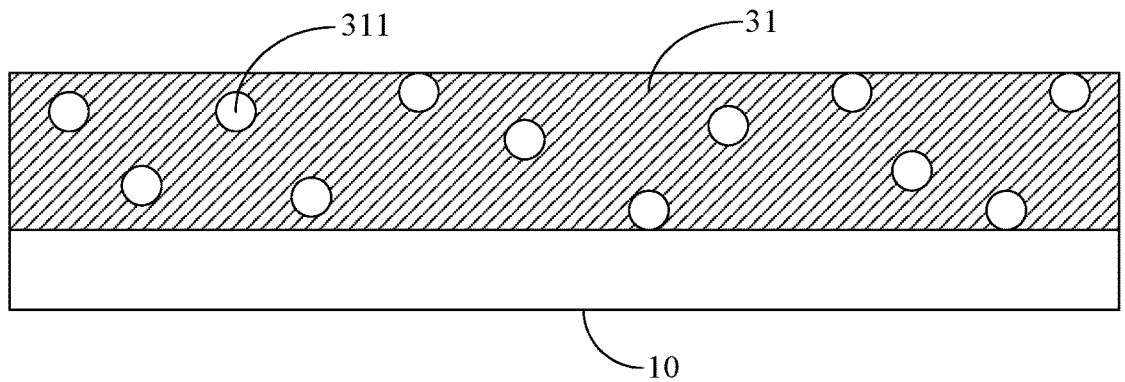
FIGS. 3 to 5 are schematic views of structures at different steps of a method for manufacturing an array substrate according to an embodiment of the disclosure.
Figure 4:
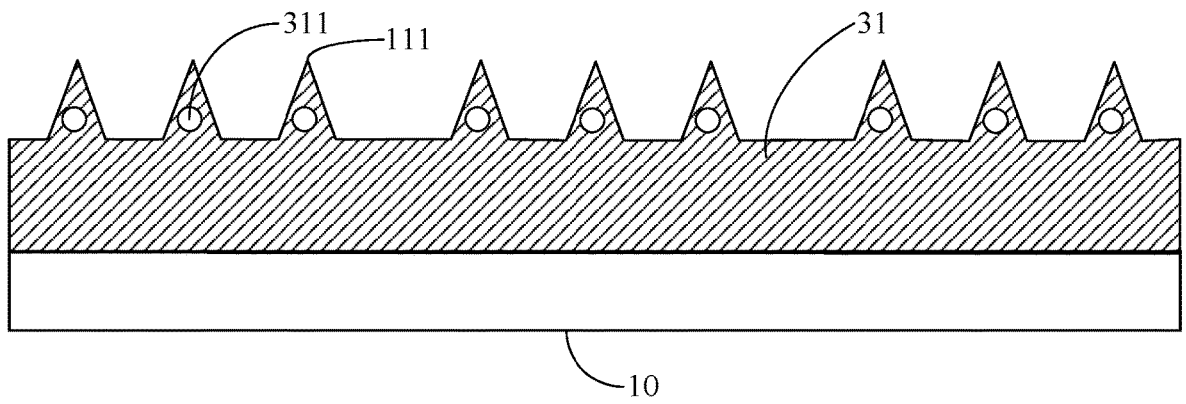
Figure 5:
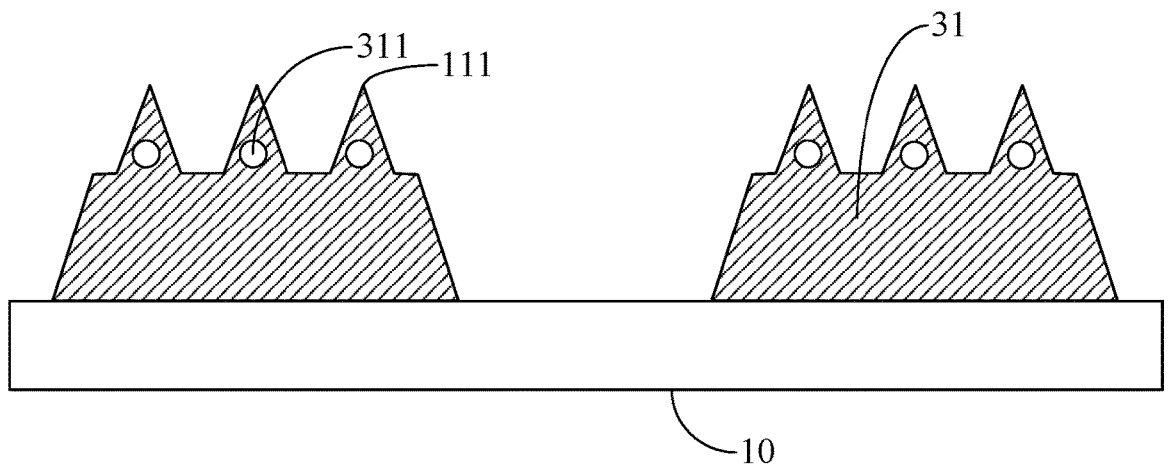

FIGS. 3 to 5 are schematic views of structures at different steps of a method for manufacturing an array substrate according to an embodiment of the present disclosure.

As shown in FIG. 3, first, a substrate is provided; a photoresist layer 31 is coated on the substrate 10, the photoresist layer 31 contains nanoparticles 311. A concentration of the nanoparticles in the photoresist layer is about 0.2 wt % to about 5 wt %. Specifically, the substrate 10 is a glass substrate on which a driving circuit of the OLED is fabricated, and the nanoparticles 311 are nanoparticles of ferroferric oxide. The photoresist layer 31 is then subjected to a pre-baking treatment at a temperature of from about 80° C. to about 120° C. for a time period of about 10 seconds to about 300 seconds.

Next, as shown in FIG. 4, a magnetic field is applied to the photoresist layer 31. For example, an intensity of the magnetic field is about 50 gauss to about 500 gauss. Specifically, the substrate 10 coated with the photoresist layer 31 is placed in an external magnetic field, the magnetic field is located above the substrate 10, the photoresist layer 31 contains the nanoparticles 311 and the nanoparticles 311 are nanoparticles of ferroferric oxide, that is, the nanoparticles 311 are magnetic particles. At this time, the nanoparticles 311 of a certain concentration moves towards the direction away from the substrate 10 under the external magnetic field, so that a plurality of protrusion structures 111 are formed on a side of the photoresist layer 31 distal to the substrate 10. The protrusion structures 111 have a height related to the intensity of the magnetic field; a distance between two adjacent protrusion structures 111 is related to the concentration of the nanoparticles 311, and the protrusion structures 111 may have the hydrophobic property in a manner of such physical structure. The protrusion structures 111 in the embodiment of the present disclosure each have a cone shape as an example, and the embodiment of the present disclosure does not limit a specific shape of the protrusion structure 111. In other embodiments of the present disclosure, the protrusion structures 111 may have other shapes.

Finally, as shown in FIG. 5, a patterning process is performed on the photoresist layer 31 with the plurality of protrusion structures 111 formed thereon as shown in FIG. 4. Specifically, the photoresist layer 31 with the plurality of protrusion structures 111 formed thereon as shown in FIG. 4 is subjected to exposure, development, post-baking and other processes to form the defining film layer, that is, to form a base structure on the substrate and at least one protrusion structure on the base structure. FIG. 5 illustrates a defining film layer formed, and the defining film layer shown in FIG. 5 constitutes the pixel definition layer of the embodiment of the present disclosure, and a surface of the pixel definition layer is formed with a projection structure 111 having the hydrophobic property.

In an alternative embodiment, as shown in FIG. 3, the nanoparticles 311 contained in the photoresist layer 31 may alternatively be charged nanoparticles. Specifically, the nanoparticles 311 are charged particles of titanium dioxide. An electric field may be applied to the photoresist layer 31. Specifically, the substrate 10 coated with the photoresist layer 31 is placed in an external electric field, the photoresist layer 31 contains the nanoparticles 311 and the nanoparticles 311 are charged nanoparticles. At this time, the nanoparticles 311 of a certain concentration moves towards the direction away from the substrate 10 under the external electric field, so that a plurality of protrusion structures 111 are formed on a side of the photoresist layer 31 distal to the substrate 10. The protrusion structures 111 have a height related to an intensity of the electric field; a distance between two adjacent protrusion structures 111 is related to the concentration of the nanoparticles 311.

The foregoing is illustrative of only some embodiments of the present disclosure, and it will be appreciated by one of ordinary skill in the art that various modifications and adaptations may be made without departing from principles of the present disclosure, and are intended to be within a scope of the present disclosure.

What is claimed is:

1. An array substrate, comprising a substrate and a pixel definition layer on the substrate, wherein the pixel definition layer comprises:
    a base structure on the substrate, wherein the base structure defines a plurality of openings on the substrate, and each of the plurality of openings corresponds to one pixel region; and
    at least one protrusion structure on the base structure, wherein the at least one protrusion structure protrudes towards a direction away from the substrate, and the at least one protrusion structure has hydrophobic property;
    wherein the at least one protrusion structure comprises at least one kind of nanoparticles, which are selected from magnetic particles and charged particles.

2. The array substrate of claim 1, wherein a height of the at least one protrusion structure in a direction perpendicular to the substrate is in a range from about 100 nm to about 800 nm.

3. The array substrate of claim 2, wherein a height of the base structure in a direction perpendicular to the substrate is in a range of about 1 µm to about 5 µm.

4. The array substrate of claim 3, wherein the at least one protrusion structure has a cone shape.

5. The array substrate of claim 1, wherein the nanoparticle has a diameter of about 20 nm to about 200 nm.

6. The array substrate of claim 5, wherein
    the nanoparticle is the magnetic particle, and a material of the nanoparticle comprises one or more of ferroferric oxide, ferric oxide and ferrous oxide; or
    the nanoparticle is the charged particle, and a material of the nanoparticle comprises titanium dioxide.

7. The array substrate of claim 6, wherein the at least one protrusion structure comprises a plurality of protrusion structures on the base structure, which protrude towards the direction away from the substrate, the plurality of protrusion structures are uniformly distributed on the base structure, and a distance between two adjacent protrusion structures is in a range of about 50 nm to about 800 nm.

8. The array substrate of claim 7, wherein a material of the at least one protrusion structure comprises one or more of polymethyl methacrylate, fluorinated polymethyl methacrylate, polyimide, and fluorinated polyimide.

9. The array substrate of claim 8, wherein the at least one protrusion structure is integrally formed with the base structure as a single piece.

10. The array substrate of claim 9, further comprising an organic light emitting diode in each of a plurality of pixel regions defined by the pixel definition layer.

11. A display panel, comprising the array substrate of claim 1.

12. A display apparatus, comprising the display panel of claim 11.

13. A method for manufacturing an array substrate, comprising:
    providing a substrate;
    coating a photoresist layer on the substrate such that the photoresist layer contains at least one kind of nanoparticles, which are selected from magnetic particles and charged particles;
    applying an external force to the photoresist layer such that a base and at least one protrusion structure which is provided on the base and protrudes towards a direction away from the substrate are formed in the photoresist layer, and the at least one protrusion structure has hydrophobic property, and the at least protrusion structure comprises the at least one kind of nanoparticles, which are selected from magnetic particles and charged particles; and
    performing a patterning process on the photoresist layer with the at least one protrusion structure formed thereon, to form a base structure on the substrate and at least one protrusion structure on the base structure, such that the base structure defines a plurality of openings on the substrate, and each of the plurality of openings corresponds to one pixel region.

14. The method of claim 13, wherein the at least one protrusion structure has a cone shape,
    a height of the at least one protrusion structure in a direction perpendicular to the substrate is in a range from about 100 nm to about 800 nm; and a height of the base structure in a direction perpendicular to the substrate is in a range of about 1 μm to about 5 μm.

15. The method of claim 14, wherein a concentration of the nanoparticles in the photoresist layer is about 0.2 wt % to about 5 wt %.

16. The method of claim 15, wherein before the applying the external force to the photoresist layer, the method further comprises:

performing a pre-baking treatment on the photoresist layer.

17. The method of claim 15, wherein the nanoparticles are magnetic particles, and the applying an external force to the phototresist layer such that a base and at least one protrusion structure which is provided on the base and protrudes towards a direction away from the substrate are formed in the photoresist layer comprises:

placing the substrate coated with the photoresist layer in an external magnetic field to cause the magnetic particles to move towards the direction away from the substrate, such that the at least one protrusion structure which protrudes towards the direction away from the substrate is formed in the photoresist layer.

18. The method of claim 15, wherein the nanoparticles are charged particles, and the applying an external force to the photoresist layer such that a base and at least one protrusion structure which is provided on the base and protrudes towards a direction away from the substrate are formed in the photoresist layer comprises:

placing the substrate coated with the photoresist layer in an external electric field to cause the charged particles to move towards the direction away from the substrate, such that the at least one protrusion structure which protrudes towards the direction away from the substrate is formed in the photoresist layer.

* * * * *